(12) United States Patent
Bian et al.

(10) Patent No.: US 11,719,895 B1
(45) Date of Patent: Aug. 8, 2023

(54) SPOT-SIZE CONVERTERS WITH ANGLED FACETS

(71) Applicant: GlobalFoundries U.S. Inc., Malta, NY (US)

(72) Inventors: Yusheng Bian, Ballston Lake, NY (US); Nicholas Polomoff, Hopewell Junction, NY (US); Keith Donegan, Saratoga Springs, NY (US); Qizhi Liu, Lexington, MA (US); Steven M. Shank, Jericho, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 17/679,188

(22) Filed: Feb. 24, 2022

(51) Int. Cl.
*G02B 6/42* (2006.01)
*H01S 5/02251* (2021.01)
*G02B 1/00* (2006.01)

(52) U.S. Cl.
CPC ........ *G02B 6/4212* (2013.01); *G02B 6/421* (2013.01); *G02B 6/4245* (2013.01); *H01S 5/02251* (2021.01); *G02B 1/002* (2013.01)

(58) Field of Classification Search
None
See application file for complete search history.

(56) References Cited

U.S. PATENT DOCUMENTS

| | | | | |
|---|---|---|---|---|
| 4,516,828 A | * | 5/1985 | Steele | G02B 6/4203 385/24 |
| 5,764,840 A | * | 6/1998 | Wach | G02B 6/4203 385/124 |
| 8,958,672 B2 | * | 2/2015 | Mullaney | G02B 6/4459 385/100 |
| 9,090,666 B2 | * | 7/2015 | Wang | G01N 27/44721 |
| 10,444,433 B1 | * | 10/2019 | Bian | G02B 6/136 |
| 10,816,726 B1 | | 10/2020 | Peng et al. | |
| 10,983,200 B1 | | 4/2021 | Shen et al. | |
| 10,989,876 B1 | | 4/2021 | Peng et al. | |
| 2003/0068152 A1 | * | 4/2003 | Gunn, III | G02B 6/1228 385/132 |
| 2010/0303412 A1 | | 12/2010 | Okuno et al. | |
| 2014/0037255 A1 | * | 2/2014 | Mullaney | G02B 6/4471 385/100 |
| 2017/0207600 A1 | | 7/2017 | Klamkin et al. | |
| 2019/0018198 A1 | | 1/2019 | Sayyah et al. | |
| 2021/0278611 A1 | | 9/2021 | Sahin et al. | |

OTHER PUBLICATIONS

Yusheng Bian, "Edge Couplers With a Partially-Etched Inverse Taper" filed Aug. 5, 2020 as U.S. Appl. No. 16/985,645.

(Continued)

*Primary Examiner* — Jerry Rahll
(74) *Attorney, Agent, or Firm* — Thompson Hine LLP; Anthony Canale

(57) ABSTRACT

Structures including an edge coupler, and methods of fabricating a structure that includes an edge coupler. The structure includes an edge coupler having a waveguide core with an end surface and a longitudinal axis. The end surface defines a plane tilted in a first direction at a first acute angle relative to the longitudinal axis and tilted in a second direction at a second acute angle relative to the longitudinal axis. The second direction differs from the first direction.

20 Claims, 4 Drawing Sheets

(56) References Cited

OTHER PUBLICATIONS

Kevin K. Dezfulian et al., "Hybrid Edge Couplers With Layers in Multiple Levels" filed Feb. 8, 2021 as a U.S. Appl. No. 17/169,971.

Yusheng Bian, "Edge Couplers With Metamaterial Rib Features" filed Jul. 7, 2021 as a U.S. Appl. No. 17/369,253.

Bartlomiej Jan Pawlak, "Photonics Chips and Semiconductor Products Having Angled Optical Fibers" filed Oct. 25, 2021 as a U.S. Appl. No. 17/510,329.

Siannis Poulopoulos et al., "Angled 3 D Glass-to-SiPh adiabatic coupler," European Conference of Integrated Optics, Corpus ID: 53139146, pp. 1-4 (2016).

Mu, Xin et al., "Edge Couplers in Silicon Photonic Integrated Circuits: A Review," Applied Sciences. 10. 1538. 10.3390/app10041538 (2020).

J. V. Galan, "CMOS compatible silicon etched V-grooves integrated with a SOI fiber coupling technique for enhancing fiber-to-chip alignment", Proc. 6th IEEE Int. Conf. Group IV Photon., pp. ThP13 (2009).

B. Snyder et al., "Ultra-broadband, polarization-insensitive SMF-28 fiber edge couplers for silicon photonics," 2017 IEEE CPMT Symposium Japan (ICSJ), pp. 55-58, doi: 10.1109/ICSJ.2017.8240087 (2017).

K. Giewont et al., "300-mm Monolithic Silicon Photonics Foundry Technology," in IEEE Journal of Selected Topics in Quantum Electronics, vol. 25, No. 5, pp. 1-11, Sep.-Oct. 2019, Art No. 8200611, doi: 10.1109/JSTQE.2019.2908790.

Y. Bian et al., "3D Integrated Laser Attach Technology on 300-mm Monolithic Silicon Photonics Platform," 2020 IEEE Photonics Conference (IPC), pp. 1-2, doi: 10.1109/IPC47351.2020.9252280 (2020).

B. Peng et al., "A CMOS Compatible Monolithic Fiber Attach Solution with Reliable Performance and Self-alignment," in Optical Fiber Communication Conference (OFC), OSA Technical Digest (Optica Publishing Group, 2020), paper Th3I.4 (2020).

Y. Bian et al., "Towards low-loss monolithic silicon and nitride photonic building blocks in state-of-the-art 300mm CMOS foundry," in Frontiers in Optics / Laser Science, B. Lee, C. Mazzali, K. Corwin, and R. Jason Jones, eds., OSA Technical Digest (Optica Publishing Group, 2020), paper FW5D.2 (2020).

M. Rakowski et al., "45nm CMOS—Silicon Photonics Monolithic Technology (45CLO) for next-generation, low power and high speed optical interconnects," in Optical Fiber Communication Conference (OFC), OSA Technical Digest Optica Publishing Group, 2020), paper T3H.3 (2020).

Y. Bian et al., "Monolithically integrated silicon nitride platform," 2021 Optical Fiber Communications Conference and Exhibition (OFC), pp. 1-3 (2021).

Y. Bian et al., "Hybrid III-V laser integration on a monolithic silicon photonic platform," 2021 Optical Fiber Communications Conference and Exhibition (OFC), pp. 1-3 (2021).

European Patent Office, Extended European Search Report and Written Opinion issued in European Patent Application No. 22199632.5 dated Jun. 12, 2023 (11 pages).

* cited by examiner

SPOT-SIZE CONVERTERS WITH ANGLED FACETS

BACKGROUND

The disclosure relates to photonics chips and, more specifically, to structures including an edge coupler, and methods of fabricating a structure that includes an edge coupler.

Photonics chips are used in many applications and systems including, but not limited to, data communication systems and data computation systems. A photonics chip integrates optical components, such as waveguides, photodetectors, modulators, and optical power splitters, and electronic components, such as field-effect transistors, into a unified platform. Factors such as layout area, cost, and operational overhead may be reduced by the integration of both types of components on the same chip.

An edge coupler, also known as a spot-size converter, is commonly used for coupling light of a given mode from a light source, such as a laser or an optical fiber, to optical components on the photonics chip. The edge coupler may include a section of a waveguide core that defines an inverse taper having a tip. In the edge coupler construction, the narrow end of the inverse taper provides a facet at the tip that is positioned adjacent to the light source, and the wide end of the inverse taper is connected with another section of the waveguide core that routes the light to the optical components of the photonics chip.

The gradually-varying cross-sectional area of the inverse taper supports mode transformation and mode size variation associated with mode conversion when light is transferred from the light source to the edge coupler. The tip of the inverse taper is unable to fully confine the incident mode received from the light source because the cross-sectional area of the tip is considerably smaller than the mode size. Consequently, a significant percentage of the electromagnetic field of the incident mode is distributed about the tip of the inverse taper. As its width increases, the inverse taper can support the entire incident mode and confine the electromagnetic field.

Conventional edge couplers may exhibit significant back reflection and optical return loss arising from mode mismatch. Satisfactory corrective measures have proven difficult to identify and implement.

Improved structures including an edge coupler and methods of fabricating a structure that includes an edge coupler are needed.

SUMMARY

In an embodiment of the invention, a structure includes an edge coupler having a waveguide core with an end surface and a longitudinal axis. The end surface defines a plane tilted in a first direction at a first acute angle relative to the longitudinal axis and tilted in a second direction at a second acute angle relative to the longitudinal axis. The second direction differs from the first direction.

In an embodiment of the invention, a method includes patterning a layer of a material to form an edge coupler that includes a waveguide core having an end surface and a longitudinal axis. The end surface defines a plane tilted in a first direction at a first acute angle relative to the longitudinal axis and tilted in a second direction at a second acute angle relative to the longitudinal axis, and the second direction is different than the first direction.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
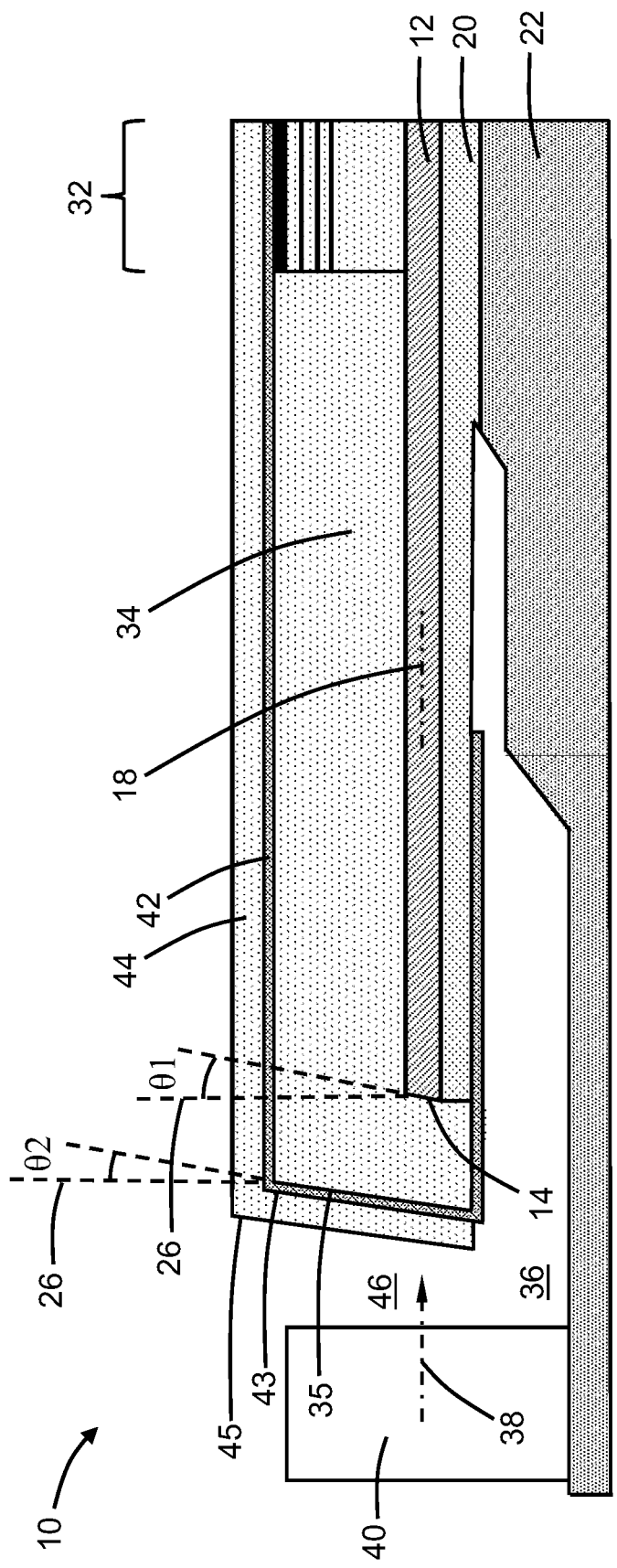
FIG. 1 is a diagrammatic cross-sectional view from a side perspective of a structure in accordance with embodiments of the invention.
Figure 2:
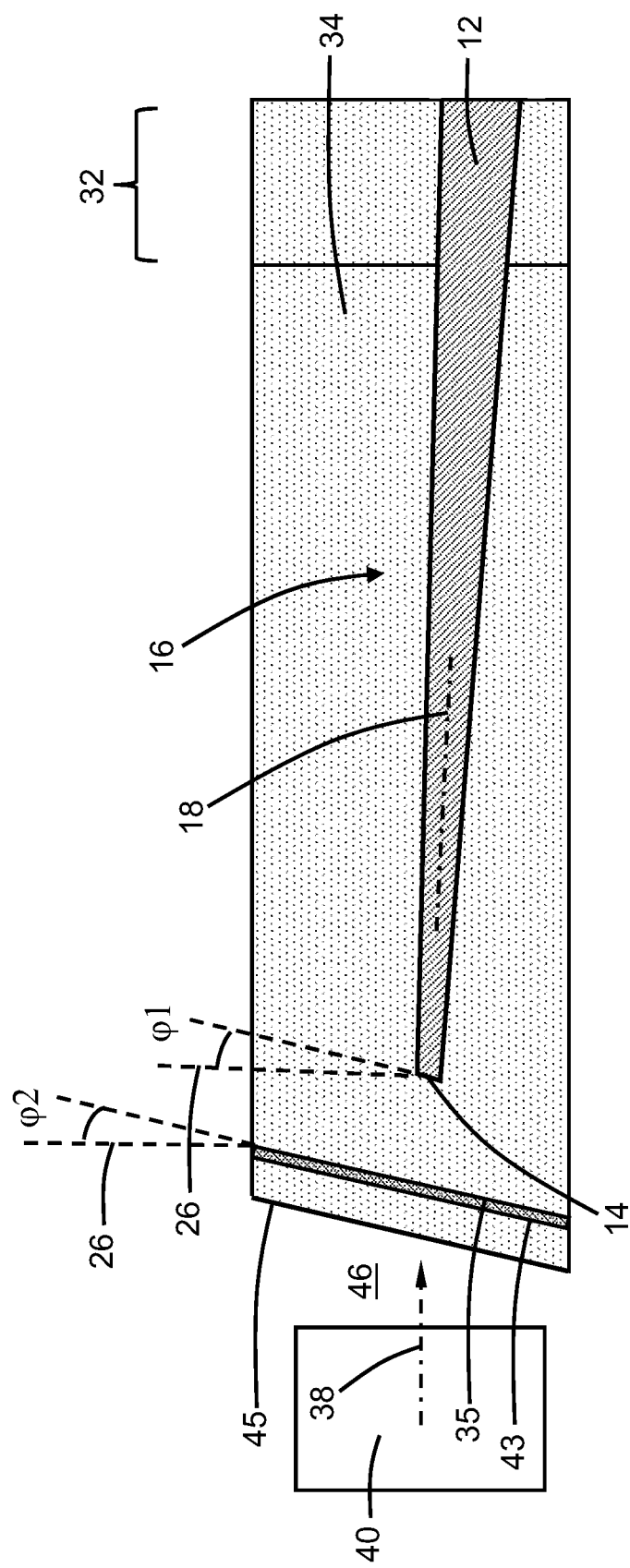
FIG. 2 is a diagrammatic cross-sectional view from a top perspective of the structure of FIG. 1.

With reference to FIGS. 1, 2 and in accordance with embodiments of the invention, a structure 10 includes a waveguide core 12 that is aligned along a longitudinal axis 18. The waveguide core 12 has an end surface 14 and an inverse taper 16 that terminates at the end surface 14. An inverse taper refers to a tapered section of a waveguide core characterized by a gradual increase in width along a mode propagation direction. The inverse taper 16 of the waveguide core 12 may participate in defining an edge coupler (i.e., a spot-size converter) and the end surface 14 may define a facet of the edge coupler. The edge coupler is arranged to initially receive light from a light source, such as an optical fiber or a semiconductor laser, at the end surface 14. Light is guided by the inverse taper 16 in a direction from the end surface 14 toward a non-tapered section of the waveguide core 12 that guides the light away from the edge coupler.

In alternative embodiments, the edge coupler may have a different construction, such as a ribbed waveguide core, a metamaterial waveguide core, a non-tapered waveguide core, multiple waveguide cores, etc.

The waveguide core 12 may be positioned over a dielectric layer 20 and a substrate 22. In an embodiment, the dielectric layer 20 may be comprised of a dielectric material, such as silicon dioxide, and the substrate 22 may be comprised of a semiconductor material, such as single-crystal silicon. In an embodiment, the dielectric layer 20 may be a buried oxide layer of a silicon-on-insulator substrate, and the dielectric layer 20 may separate the waveguide core 12 from the substrate 22. In an embodiment, the waveguide core 12 may be comprised of a dielectric material, such as silicon nitride, that is deposited as layer on the dielectric layer 20 and patterned by lithography and etching processes.

In an alternative embodiment, the waveguide core 12 may be comprised of a different dielectric material, such as silicon oxynitride. In an alternative embodiment, the waveguide core 12 may be comprised of a semiconductor material, such as single-crystal silicon, and may be formed by patterning a device layer of the silicon-on-insulator substrate by lithography and etching processes. In an alternative embodiment, the waveguide core 12 may be comprised of a compound semiconductor material. In an alternative embodiment, the waveguide core 12 may be comprised of a polymer.

The end surface 14 of the waveguide core 12, which defines the facet of the edge coupler, is angled with tilts or inclinations in multiple directions relative to the longitudinal axis 18. More specifically, the end surface 14 defines a plane that is angled in multiple directions transverse to the longitudinal axis 18 of the waveguide core 12. The longitudinal axis 18 is aligned as a normal to a plane 26, which may contain a vertical direction and a horizontal direction transverse to the vertical direction. As best shown in FIG. 1, the end surface 14 defines a plane that is tilted in a first direction at an acute angle θ1 relative to the plane 26. The plane of the end surface 14 is tilted in the first direction relative to the longitudinal axis 18 at an acute angle that is the complement to the acute angle θ1. The plane of the end surface 14 may be considered to be inclined relative to the vertical direction at the acute angle that is the complement to the acute angle θ1. As best shown in FIG. 2, the plane of the end surface 14 is tilted in a second direction at an acute angle φ1 relative to the plane 26. The plane of the end surface 14 is tilted in the second direction relative to the longitudinal axis 18 at an acute angle that is the complement to the acute angle φ1. The plane of the end surface 14 may be considered to be inclined relative to the horizontal direction at the acute angle that is the complement to the acute angle φ1. In an embodiment, the first direction of tilting may be transverse (i.e., orthogonal) to the second direction of tilting. The etch mask and/or the etching process used during the patterning of the waveguide core 12 may be tailored to provide the multi-directional tilting of the end surface 14.

A back-end-of-line stack 32 is positioned over a portion of the waveguide core 12. The back-end-of-line stack 32 may include a layer stack containing interlayer dielectric layers comprised of silicon dioxide and intralayer dielectric layers comprised of silicon-carbon nitride (e.g., nitrogen-doped silicon carbide) that alternate with the interlayer dielectric layers. A section of the back-end-of-line stack 32 may be removed by lithography and etching processes and replaced by a dielectric layer 34 that lacks the stacked layering of diverse dielectric materials present in the back-end-of-line stack 32. The dielectric layer 34, which is positioned over the inverse taper 16 of the waveguide core 12, may be comprised of a dielectric material, such as silicon dioxide.

A cavity 36 may be formed in the substrate 22 by lithography and etching processes. The cavity 36 may be formed by a multiple-step process culminating in a wet chemical etch characterized by etch rates dependent upon crystalline direction to provide the cavity 36 with a V-shape or U-shape. The cavity 36 may extend laterally in the substrate 22 beneath the dielectric layer 20 as an undercut that is located under a portion of the inverse taper 16 of the waveguide core 12. In an alternative embodiment, the cavity 36 may be formed in the substrate 22 without forming the undercut and/or without an etch that is crystalline-direction dependent. In an embodiment, the cavity 36 may be open-ended to define a groove in the substrate 22.

The dielectric layer 34 may be patterned when the cavity 36 is formed. In an embodiment and as best shown in FIG. 1, the dielectric layer 34 includes a surface 35 that may be tilted in a first direction at an acute angle θ2 relative to the plane 26. The plane of the surface 35 of the dielectric layer 34 may be tilted in the first direction relative to the longitudinal axis 18 of the waveguide core 12 at an acute angle that is the complement to the acute angle θ2. The plane of the surface 35 may be considered to be inclined relative to the vertical direction at the acute angle that is the complement to the acute angle φ2. In an embodiment and as best shown in FIG. 2, the plane of the surface 35 of the dielectric layer 34 may be tilted in a second direction at an acute angle φ2 relative to the plane 26. The plane of the surface 35 of the dielectric layer 34 may be tilted in the second direction relative to the longitudinal axis 18 of the waveguide core 12 at an acute angle that is the complement to the acute angle φ2. The plane of the surface 35 may be considered to be inclined relative to the horizontal direction at an acute angle that is the complement to the acute angle φ2. In an embodiment, the first direction of tilting may be transverse (i.e., orthogonal) to the second direction of tilting. The etch mask and/or the etching process used during the patterning of the dielectric layer 34 may be tailored to provide the multi-directional tilting of the surface 35.

A light source 40 may be positioned in the cavity 36 adjacent to the end surface 14 of the waveguide core 12. The light source 40 may be configured to emit and direct light (e.g., laser light) in a mode propagation direction 38 toward the inverse taper 16 of the waveguide core 12. The light from the light source 40 may be aligned in vertical and horizontal directions to intercept the end surface 14 of the waveguide core 12. The light may have a given wavelength, intensity, mode shape, and mode size, and the edge coupler may provide spot size conversion for the light. In an embodiment, the light source 40 may be a semiconductor laser that is attached by, for example, flip-chip bonding inside the cavity 36. In an embodiment, the light source 40 may be an optical fiber that is placed into the cavity 36 and secured.

The inverse taper 16 of the waveguide core 12 is embedded in the dielectric layer 34 such that a portion of the dielectric layer 34 is positioned between the end surface 14 of the waveguide core 12 and the light source 40. Dielectric layers 42, 44 may be formed that also include respective portions positioned between the end surface 14 of the waveguide core 12 and the light source 40. The mode propagation direction 38 of the light from the light source 40 intersects these portions of the dielectric layers 34, 42, 44 such that the light must propagate through a thickness of the dielectric material of each of the dielectric layers 34, 42, 44. The dielectric layer 42 and the dielectric layer 44 may be comprised of different dielectric materials. For example, the dielectric layer 42 may be comprised of silicon nitride, and the dielectric layer 44 may be comprised of silicon dioxide. In an embodiment, the dielectric layers 42, 44 may be conformal such that respective surfaces 43, 45 of the dielectric layers 42, 44 adopt the angle θ2 and the angle φ2 of the surface 35 of the dielectric layer 34. The surfaces 35, 43, 45 define additional facets arranged between the light source 40 and the end surface 14 of the waveguide core 12.

The light source 40 may be spaced from the surface 45 of the dielectric layer 44 by a gap 46, which may be contiguous with the cavity 36. The gap 46, as well as the cavity 36, may be filled by air. Alternatively, the gap 46, as well as the cavity 36, may be filled by an index-matching material, such as an adhesive, that provides a closer, but not identical, match with the refractive index of the dielectric layers 34, 42, 44 than air. In an embodiment, the dielectric layer 42 may function as a moisture barrier.

Light traveling in the mode propagation direction 38 from the light source 40 to the edge coupler traverses multiple interfaces between different materials to reach the end surface 14 of the waveguide core 12. At each of these interfaces, a fraction of the incident light is reflected due to the change in refractive index (i.e., index of refraction) correlated with the change in materials and a fraction of the incident light is transmitted. The sum of the fractions of reflected incident light from all interfaces amount to an aggregate reflection loss for the edge coupler.

An interface exists at the transition from the dielectric layer 34 to the end surface 14 of the waveguide core 12. At this interface, the refractive index changes from the refractive index of the material constituting the dielectric layer 34 to the refractive index of the material constituting the waveguide core 12. Light incident at this interface is reflected at an angle that is equal to the angle of incidence. The multi-directional angling of the end surface 14 of the waveguide core 12 may be selected to direct the reflected light to an optical path that falls outside of a numerical aperture of the light source 40. The numerical aperture is a dimensionless number that characterizes the range of angles over which the light source 40 can accept reflected light. By directing the optical path for the reflected light to an angle greater than the numerical aperture, optical return to the light source 40 due to reflection from this interface may be significantly reduced or eliminated.

An interface exists at the transition from the air or index-matching material in the gap 46 to the surface 45 of the dielectric layer 44. At this interface, the refractive index changes from the refractive index of air or index-matching material to the refractive index of the material constituting the dielectric layer 44. Another interface exists at the transition from the dielectric layer 44 to the surface 43 of the dielectric layer 42. At this interface, the refractive index changes from the refractive index of the material constituting the dielectric layer 44 to the refractive index of the material constituting the dielectric layer 42. Another interface exists at the transition from the dielectric layer 42 to the surface 35 of the dielectric layer 34. At this interface, the refractive index changes from the refractive index of the material constituting the dielectric layer 42 to the refractive index of the material constituting the dielectric layer 34. Light incident at each of these additional interfaces is reflected at an angle that is equal to the angle of incidence. The multi-directional angling of the surface 35 of the dielectric layer 34, the surface 43 of the dielectric layer 42, and the surface 45 of the dielectric layer 44 may be selected to direct the reflected light to an optical path that falls outside of the numerical aperture range of the light source 40. By directing the optical paths for the reflected light at these interfaces to angles greater than the numerical aperture, optical return to the light source 40 due to reflection from these interfaces may be significantly reduced or eliminated.

The longitudinal axis 18 of the waveguide core 12 may be angled (i.e., rotated or tilted) at an acute angle relative to the mode propagation direction 38 of the light, instead of being aligned parallel to the mode propagation direction 38. The angling of the longitudinal axis 18 of the waveguide core 12 may effectively increase the tilting of the interfaces with regard to directing the optical paths for the reflected light at the interfaces to angles greater than the numerical aperture.

The structure including the edge coupler, in any of its embodiments described herein, may be integrated into a photonics chip that includes electronic components and additional optical components. For example, the electronic components may include field-effect transistors that are fabricated by CMOS processing.

Figure 3:
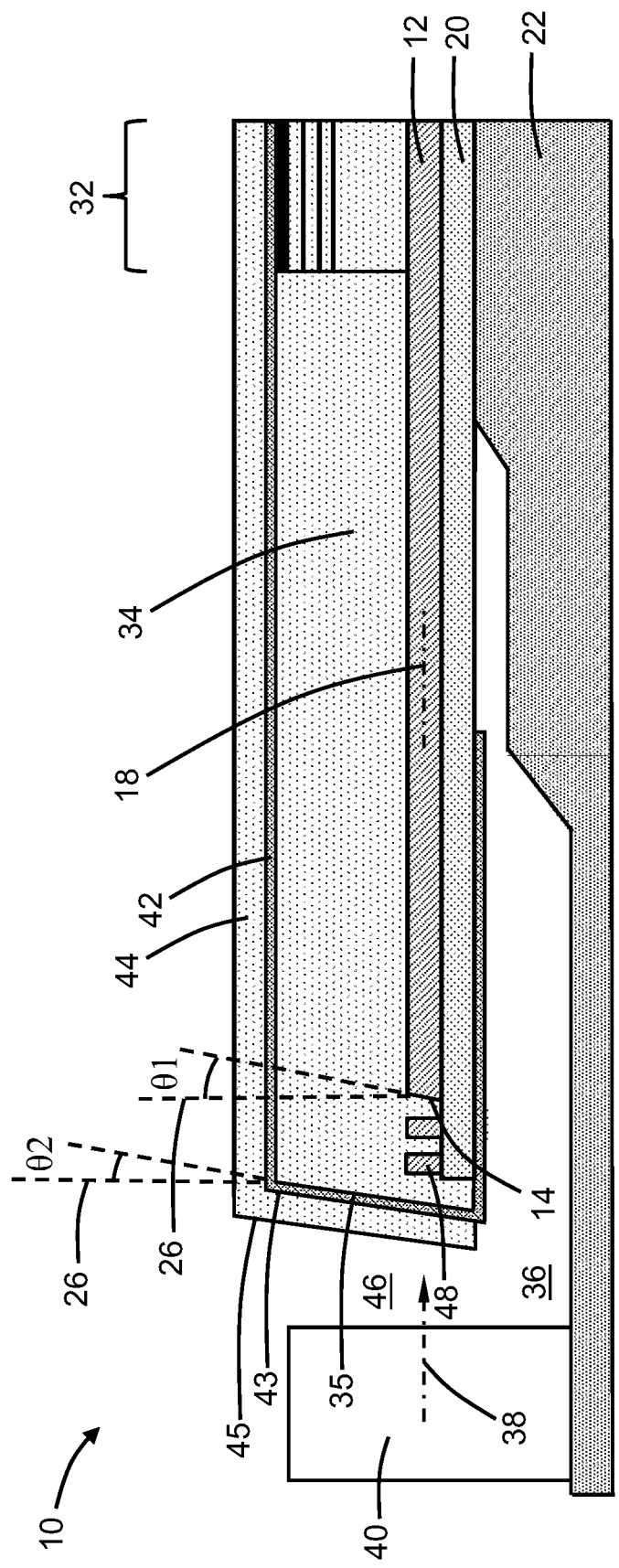
FIG. 3 is a diagrammatic cross-sectional view from a side perspective of a structure in accordance with alternative embodiments of the invention.
Figure 4:
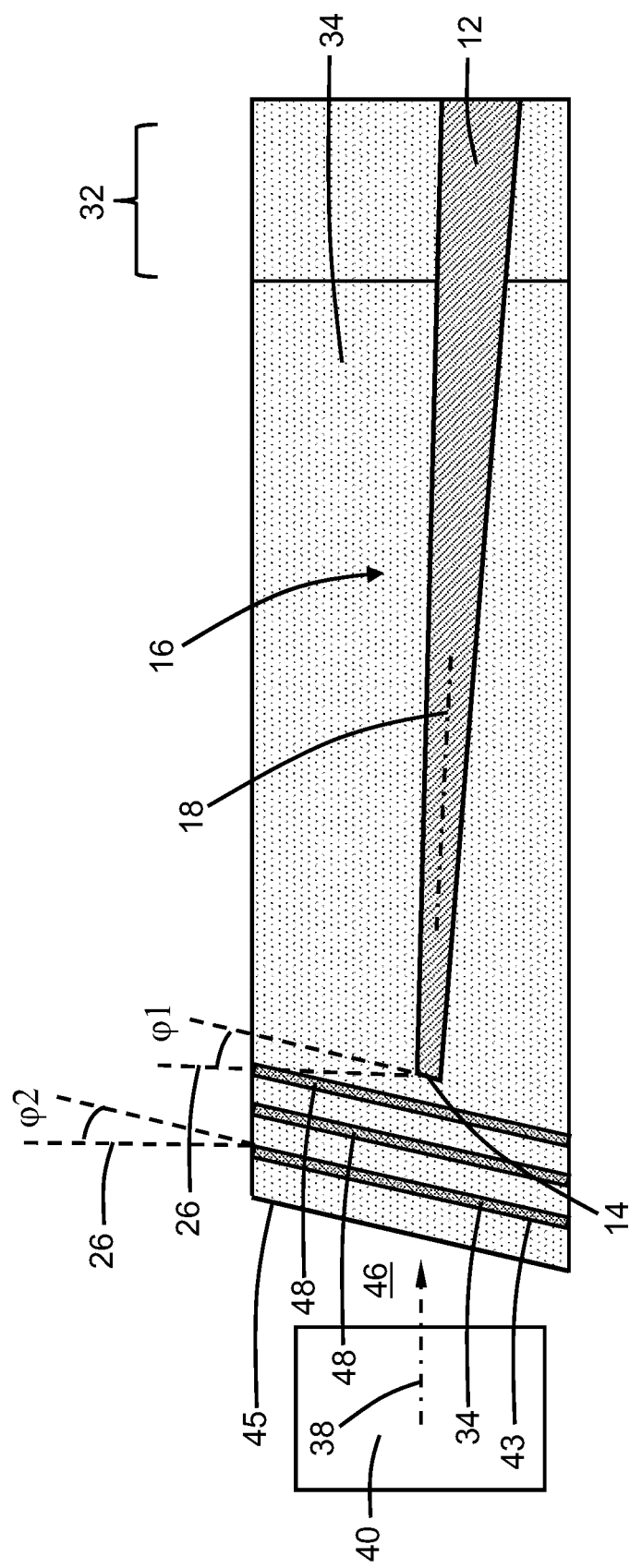
FIG. 4 is a diagrammatic cross-sectional view from a top perspective of the structure of FIG. 3.

With reference to FIGS. 3, 4 in which like reference numerals refer to like features in FIGS. 1, 2 and in accordance with alternative embodiments, one or more additional features 48 may be formed that are arranged within the dielectric layer 34 and positioned on the dielectric layer 20. In an embodiment, the features 48 may be linear bars or strips having a spaced-apart, grating-like arrangement. In an embodiment, each feature 48 may be comprised of the same material as the waveguide core 12, and the features 48 may be patterned when the waveguide core 12 is patterned. In an embodiment, each feature 48 may have a front surface closest to the light source 40 and an opposite rear surface closest to the end surface 14 of the waveguide core 12. The front and rear surfaces of each feature 48 may be angled relative to the longitudinal axis 18 of the waveguide core 12. In an embodiment, the front and rear surfaces of each feature 48 may be angled at the same set of angles $\theta 1$ and $\varphi 1$ as the end surface 14 of the waveguide core 12. The front and rear surfaces of each feature 48, which are arranged in the mode propagation direction 38 of the light between the end surface 14 and the light source 40, may define interfaces with the dielectric material of the dielectric layer 34 that result in light reflection that is directed to an optical path that falls outside of the numerical aperture range of the light source 40. As a result, the multi-directional angling of the features 48 may further reduce optical return to the light source 40 due to reflection.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature with either direct contact or indirect contact.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
an edge coupler including a waveguide core having an end surface and a longitudinal axis, the end surface defining a first plane tilted in a first direction at a first acute angle relative to the longitudinal axis and tilted in a second direction at a second acute angle relative to the longitudinal axis, and the second direction different than the first direction; and
a dielectric layer having an interface with the end surface of the waveguide core and a surface that is tilted at a third acute angle relative to the longitudinal axis,
wherein the dielectric layer comprises a first material, and the waveguide core comprises a second material having a different refractive index than the first material.

2. The structure of claim 1 further comprising:
a light source configured to emit light in a propagation direction,
wherein the longitudinal axis of the waveguide core is angled relative to the propagation direction.

3. The structure of claim 2 wherein the light source is an optical fiber.

4. The structure of claim 2 wherein the light source is a semiconductor laser.

5. The structure of claim 1 wherein the second direction is orthogonal to the first direction.

6. The structure of claim 1 wherein the waveguide core comprises silicon nitride, and the dielectric layer comprises silicon dioxide.

7. A structure comprising:
an edge coupler including a waveguide core having an end surface and a longitudinal axis, the end surface defining a first plane tilted in a first direction at a first acute angle relative to the longitudinal axis and tilted in a second direction at a second acute angle relative to the longitudinal axis, and the second direction different than the first direction; and
a light source configured to emit light in a propagation direction,
wherein the light source has a numerical aperture, and the first acute angle and the second acute angle are selected such that the end surface is inclined to direct the light reflected from the end surface to an optical path outside of the numerical aperture of the light source.

8. The structure of claim 7 further comprising:
a first dielectric layer; and
a second dielectric layer having a first interface with the first dielectric layer,
wherein the first dielectric layer comprises a first material, the second dielectric layer comprises a second material having a different refractive index than the first material, the first interface defines a second plane tilted in a third direction at a third acute angle relative to the longitudinal axis and tilted at a fourth direction at a fourth acute angle relative to the longitudinal axis, and the fourth direction is different than the third direction.

9. The structure of claim 8 wherein the fourth direction is orthogonal to the third direction.

10. The structure of claim 8 further comprising:
a third dielectric layer having a second interface with the second dielectric layer,
wherein the third dielectric layer comprises a third material having a different refractive index than the first material, and the second interface is tilted at the third acute angle and tilted at the fourth acute angle.

11. The structure of claim 8 wherein the first dielectric layer has a second interface with the end surface of the waveguide core, and the waveguide core comprises a third material having a different refractive index than the first material.

12. The structure of claim 11 wherein the waveguide core includes an inverse taper that is embedded in the first dielectric layer.

13. The structure of claim 7 wherein the light source is an optical fiber.

14. The structure of claim 7 further comprising:
a dielectric layer; and
one or more features on the dielectric layer, the one or more features aligned in the first direction at the first acute angle relative to the longitudinal axis,
wherein the end surface of the waveguide core is positioned on the dielectric layer adjacent to the one or more features.

15. The structure of claim 14 wherein the waveguide core comprises a material, and the one or more features comprise the material.

16. The structure of claim 7 wherein the light source is a semiconductor laser.

17. A method comprising:
patterning a layer of a material to form an edge coupler including a waveguide core having an end surface and a longitudinal axis; and
forming a dielectric layer having an interface with the end surface of the waveguide core and a surface that is tilted at a third acute angle relative to the longitudinal axis,
wherein the dielectric layer comprises a first material, the waveguide core comprises a second material having a different refractive index than the first material, the end surface defines a first plane tilted in a first direction at a first acute angle relative to the longitudinal axis and tilted in a second direction at a second acute angle relative to the longitudinal axis, and the second direction is different than the first direction.

18. The method of claim 17 further comprising:
positioning a light source adjacent to the end surface,
wherein the light source is configured to emit light in a propagation direction, and the longitudinal axis of the waveguide core is angled relative to the propagation direction.

19. The method of claim 18 wherein the light source has a numerical aperture, and the first acute angle and the second acute angle are selected such that the end surface is configured to direct the light reflected from the end surface to an optical path outside of the numerical aperture of the light source.

20. The method of claim 17 wherein the second direction is orthogonal to the first direction.

* * * * *